US012206354B2

United States Patent
Weiss

(10) Patent No.: US 12,206,354 B2
(45) Date of Patent: Jan. 21, 2025

(54) PROTECTION CIRCUIT FOR AN ELECTRIC MOTOR WITH A SINGLE-PHASE WINDING, AN ELECTRIC CENTRIFUGAL PUMP AND AN OIL MIST SEPARATOR WITH SUCH A PROTECTION CIRCUIT

(71) Applicant: Bühler Motor GmbH, Nuremberg (DE)

(72) Inventor: Jens Weiss, Fürth (DE)

(73) Assignee: Bühler Motor GmbH, Nuremberg (DE)

( * ) Notice: Subject to any disclaimer, the term of this patent is extended or adjusted under 35 U.S.C. 154(b) by 388 days.

(21) Appl. No.: 17/344,136

(22) Filed: Jun. 10, 2021

(65) Prior Publication Data

US 2021/0305923 A1 Sep. 30, 2021

Related U.S. Application Data

(63) Continuation of application No. PCT/DE2019/200138, filed on Dec. 3, 2019.

(30) Foreign Application Priority Data

Dec. 12, 2018 (DE) .................. 10 2018 221 538.3

(51) Int. Cl.
 *H02P 6/26* (2016.01)
 *F04D 13/06* (2006.01)
 (Continued)

(52) U.S. Cl.
 CPC ............. *H02P 6/26* (2016.02); *H02H 7/0811* (2013.01); *H03K 17/08142* (2013.01); *H03K 17/08146* (2013.01); *F04D 13/06* (2013.01)

(58) Field of Classification Search
 CPC ......... H02P 6/26; H02H 7/0811; F04D 13/06; H03K 17/08142; H03K 17/08146
 See application file for complete search history.

(56) References Cited

U.S. PATENT DOCUMENTS 4,132,930 A * 1/1979 Schalk .................. H02P 6/14
 318/400.04
4,494,053 A 1/1985 Gotou
 (Continued)

FOREIGN PATENT DOCUMENTS

DE 2633047 A1 1/1978
DE 2633047 C3 11/1979
 (Continued)

OTHER PUBLICATIONS

International Search Report dated Mar. 18, 2020, issued in counterpart application No. PCT/DE2019/200138, w/ English translation (7 pages).
 (Continued)

*Primary Examiner* — Thai T Dinh
(74) *Attorney, Agent, or Firm* — WHDA, LLP

(57) ABSTRACT

A protection circuit for an electric motor with a single phase winding, consisting of two coil sections with central tapping, wherein the two coil ends of the coil sections are each connected to ground via a switching element. The task of the invention is for an electric motor of this type to ensure a thermal relief for the switching elements, improved and smoother running, reduced warming of the printed circuit board, improved EMC characteristics, a more robust design of the overall switching, a focused conduction of the losses and an extra protection against any surge impulses from a mains network.

12 Claims, 2 Drawing Sheets

(51) Int. Cl.
*H02H 7/08* (2006.01)
*H03K 17/0814* (2006.01)

(56) References Cited

U.S. PATENT DOCUMENTS

| | | | |
|---|---|---|---|
| 4,584,506 A | | 4/1986 | Kaszmann |
| 4,594,535 A | * | 6/1986 | Morikawa ................. H02P 6/14 |
| | | | 318/434 |
| 5,814,965 A | * | 9/1998 | Randall ............... H02P 25/0925 |
| | | | 318/400.11 |
| 5,903,121 A | | 5/1999 | Heine et al. |
| 7,741,799 B2 | * | 6/2010 | Horng ....................... H02P 6/26 |
| | | | 318/700 |
| 9,948,227 B2 | * | 4/2018 | Flynn ...................... H02P 27/18 |
| 10,320,378 B2 | * | 6/2019 | Handy ............... H03K 19/0016 |
| 10,823,188 B2 | | 11/2020 | Ehrsam et al. |
| 2006/0152907 A1 | | 7/2006 | Rathmann |
| 2007/0004055 A1 | * | 1/2007 | Ball ........................ H01L 23/34 |
| | | | 257/E23.08 |
| 2008/0272722 A1 | * | 11/2008 | Horng ....................... H02P 6/16 |
| | | | 318/400.38 |
| 2011/0006712 A1 | | 1/2011 | Weissbach et al. |
| 2013/0107601 A1 | * | 5/2013 | Wagoner ............... H01L 23/427 |
| | | | 363/141 |
| 2018/0254776 A1 | * | 9/2018 | Kondapalli .......... H03K 17/162 |

FOREIGN PATENT DOCUMENTS

| | | |
|---|---|---|
| DE | 3513179 A1 | 10/1986 |
| DE | 3907139 A1 | 9/1990 |
| DE | 19605834 A1 | 8/1997 |
| DE | 10239512 A1 | 3/2004 |
| DE | 202008015028 U1 | 4/2009 |
| DE | 102013215611 A1 | 3/2015 |
| DE | 102016209312 A1 | 11/2017 |
| EP | 2278339 A1 | 1/2011 |
| WO | 2015018691 A1 | 2/2015 |

OTHER PUBLICATIONS

Search Report dated Nov. 4, 2019, issued in counterpart German Patent Application No. 10 2018 221 538.3 (9 pages).

"Two-Phase Unipolar Brushless Motor Driver Automatic Recovery Type Circuit in a Miniature Flat Package", Sanyo Electric Co., Ltd. Semiconductor Business Headquaters, Tokyo Office, 1997, LB1863M, 1869M, pp. 4943-1-5, cited in ISR (5 pages).

"Application Hints for Transient Voltage Suppression Diode Circuits", ON Semiconductor, Semiconductor Components Industries, LLC, 2016, www.onsemi.com, AND8230/D, pp. 1-7, cited in ISR (7 pages).

* cited by examiner

PROTECTION CIRCUIT FOR AN ELECTRIC MOTOR WITH A SINGLE-PHASE WINDING, AN ELECTRIC CENTRIFUGAL PUMP AND AN OIL MIST SEPARATOR WITH SUCH A PROTECTION CIRCUIT

CROSS-REFERENCE TO RELATED APPLICATIONS

The present patent application claims priority from German Application No. DE 10 2018 221 538.3, filed Dec. 12, 2018, which was filed as PCT application number PCT/DE2019/200138 (Published Jun. 18, 2020). Both applications are incorporated herein by reference in their entirety.

BACKGROUND OF THE INVENTION

(1) Field of the Invention

The invention concerns protection circuitry for an electric motor with a single-phase winding, consisting of two coil sections with central tapping, wherein the two coil ends of the coil sections are each connected to ground via a switching element.

(2) Description of Related Art Including Information Disclosed Under 37 CFR 1/97 and 1.98

A commutation of an electric motor of this type is realized in that both of the switching elements are switched alternately, synchronous to the motor's speed of rotation. As a result of the alternate switching, a rotating field is generated in the electric motor's stator which drags a permanent magnet rotor. This kind of switching is also called M-switching. When the motor winding is switched, the remaining electrical energy stored in the respective coil section must be discharged. Since no free-wheeling diodes can be used for this kind of connection, the voltage on the switching element rises up to its avalanche voltage and the current flows further to ground via this switching element. This results in a rapid increase in the current. In doing so the electric loss of power can be calculated, from the time during which the impulse is active, from the avalanche voltage and the current that flows. Since the avalanche breakdown is very energy intensive, the components are subjected to a very high thermal stress. The tolerances for the thermal resistance of switching elements are, for economic reasons, very limited. If a higher motor power is desired then the thermal destruction of the components must be expected.

BRIEF SUMMARY OF THE INVENTION

The task of the present invention is therefore for an electric motor of this type to ensure thermal relief for the switching elements, improved and smoother running, reduced warming of the printed circuit board, improved EMC characteristics, a more robust design of the overall switching, a focused conduction for the losses and extra protection against any surge impulses from a mains network.

Since switching elements, for example field-effect transistors or bipolar transistors do not tolerate high voltage pulses, wherein the energy input per time unit plays a decisive role, it is proposed in the present invention that a cut-off current of a coil section of the motor is dispersed via an electrical power component that is connected to the switching element in parallel. In doing so, the energy stored in the coil section is converted into thermal energy via the resistor of the power component. As a result, the switching element is thermally considerably less stressed. In this way, the power component protects the switching element from possible thermal damage or destruction.

An essential feature of the present invention is generally that the cut-off current of a coil section can be controlled. This makes it possible to adapt to different environmental conditions or special requirements.

According to a first embodiment of the invention, the electrical power component is a power Z-diode, wherein each coil section is assigned a power Z-diode. This solution fulfills at least the requirement for thermal protection of the switching element.

In order to be able to additionally adjust and optimize the properties of the protection circuitry more easily, a second embodiment of the invention proposes using a bipolar power transistor as an electrical power component, wherein each coil section is assigned a bipolar power transistor. In order to achieve more sensitive control of the current to be dispersed, the power transistor is connected through by a bipolar control transistor, the emitter of which is connected to the base of the power transistor.

In a further development of the second embodiment, the base of the control transistor is connected to a control Z-diode operated in the reverse direction. As a result, the avalanche voltage of the control Z-diode must first be reached in order to provide a base current in the control transistor, which then switches and controls the power transistor. An additional wiring of the control transistor can positively influence the EMC behavior.

In order to avoid an excessive base-emitter voltage on the transistors, and thus to ensure quick switching, the base of the control transistor is connected to the coil end of a coil section via Schottky diodes on the one hand, and to the base of the power transistor on the other hand.

Furthermore, it is provided that an RC attenuator (snubber network) consisting of a snubber resistor and a snubber capacitor is connected between a winding end of a coil section and the ground. As a result, switching edges can be switched accurately, losses in the transistors can be reduced, and the EMC performance can be improved. Depending on the requirements, the snubber network can also contain further components.

It is expediently provided that the switching element and the bipolar power transistor are thermally decoupled. This can be achieved by the greatest possible spacing of these components from one another on the same printed circuit board or by arrangement on different printed circuit boards or support elements and/or by dissipating the heat loss via heat conducting elements, heat sinks or similar means.

Finally, the invention is achieved by a centrifugal pump having protection circuitry according to at least one of the preceding features.

The described protection circuitry can be used, for example, in a brushless DC motor with a stator winding and a permanent magnet rotor. In this case, the stator has claw poles that are wound with a cylindrical coil with center tapping.

It is known to use such brushless DC motors for motor vehicle cooling water pumps, in particular auxiliary cooling water pumps. The protection circuitry according to the invention with all variants aims is also suitable for this.

Electric motors having protection circuitry incorporating the present invention can also be used in electric oil mist separators in motor vehicles. The electric motor has a single-phase winding consisting of two coil sections having a center tapping in this case as well, wherein the two winding ends of the coil sections are connected to ground via a respective switching element, e.g. a field-effect transistor or a bipolar transistor, wherein a cut-off current of a coil section is dispersed via an electrical power component that is connected to the switching element in parallel. The other features mentioned can also be applied to this application.

BRIEF DESCRIPTION OF THE SEVERAL VIEWS OF THE DRAWINGS

The invention is described below using a plurality of exemplary embodiments which are explained in more detail with reference to Figures.

DETAILED DESCRIPTION OF THE INVENTION

Figure 1:
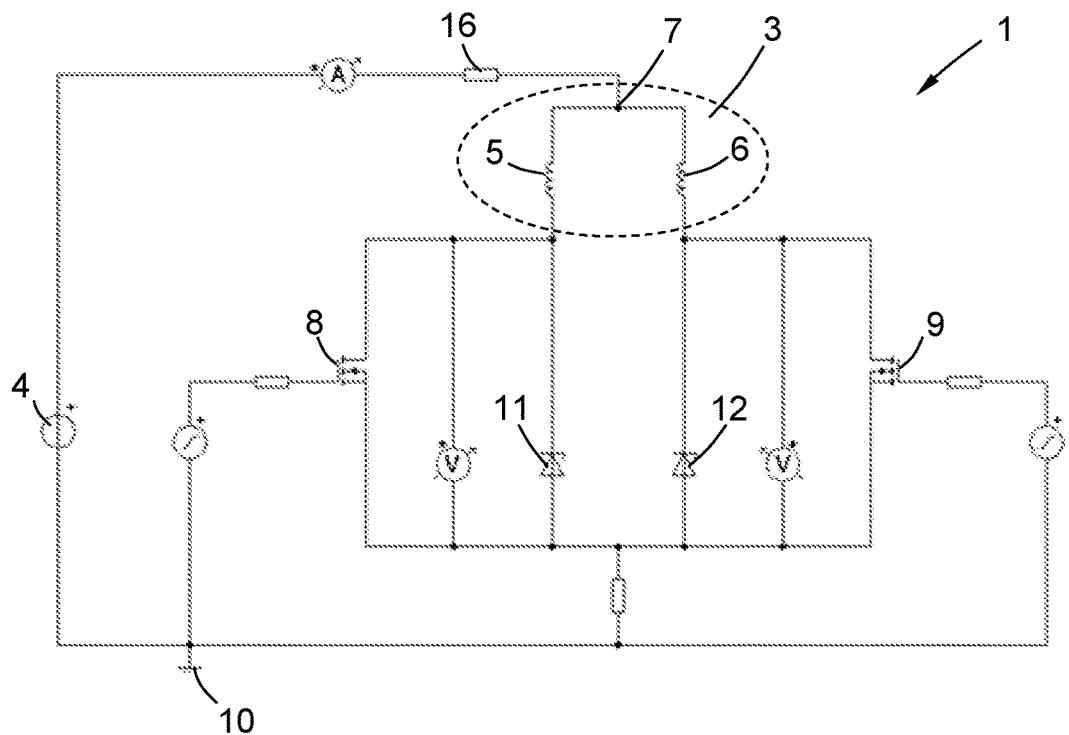
FIG. 1 shows a wiring diagram of a first embodiment of the invention.

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

Figure 2:
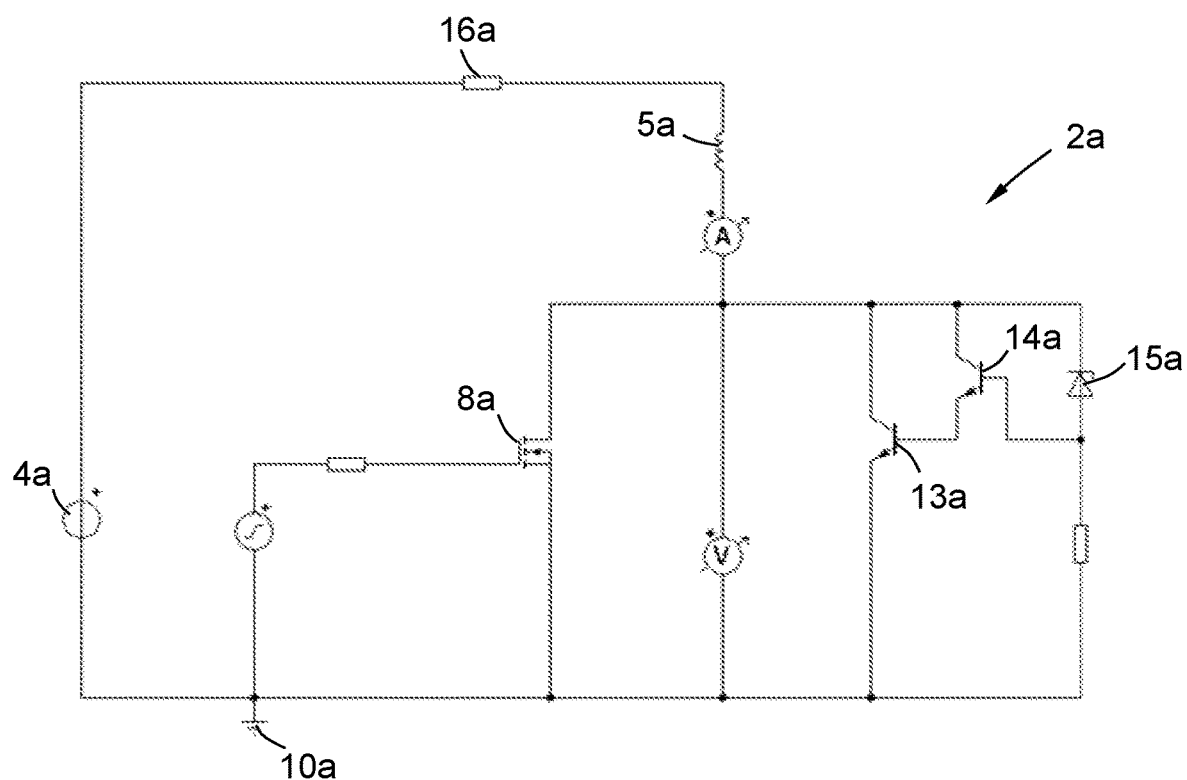
FIG. 2 shows partial circuitry of a second embodiment of the invention.

FIG. 1 shows a wiring diagram 1 of a first embodiment of the invention in order to provide an explanation of the basic function of the invention. A first coil section 5, a second coil section 6, a center tapping 7 off coils 5 and 6 that is connected to a voltage source 4 (supply voltage) are shown. The two other ends of the coil sections 5, 6 are connected to a field effect transistor (FET) 8 and/or 9, respectively. The two field-effect transistors (MOSFETs) switch the coil sections 5, 6 alternately, so that a current passes through the coil sections 5 and/or 6, respectively. An equivalent resistor 16 represents the DC resistance of the coil windings. When the first field effect transistor 8 is switched off, the inductance of the first coil section 5 drives the current further in the same direction. As a result, the voltage at the FET 8 increases until an avalanche voltage of a power-Z diode 11 connected in parallel with the FET is reached. The power Z-diode 11 becomes conductive, which is why the current no longer acts via the field-effect transistor 8 but via the power Z-diode 11. The energy of the first coil section 5 is thus no longer converted into heat at the field-effect transistor 8 but in the power Z-diode 11. The same applies to the connection of the second coil section 6 whose current is dispersed via the second field-effect transistor 9 or the second power Z-diode. If the current is dispersed from the motor winding 3 (coil section 5 or 6), the voltage at the respective power Z-diodes 11 and/or 12 decreases again and no more current is applied. FIG. 2 shows partial circuitry 2a of a second embodiment of the invention, wherein only one of two coil sections 5a is shown with its circuitry with the understanding that the discussion also applies to the other coil section 6. In this case, the energy of the coil section 5a, which becomes free as it is switched off, is not conducted via a power Z-diode but via a bipolar power transistor 13a. The base of the bipolar power transistor 13a is connected to the emitter of a control transistor 14a. The base of the control transistor 14a is electrically connected to a control Z-diode 15a.

After reaching the avalanche voltage of the control Z-diode 15a, a control current flows through via the base-emitter extensor of the control transistor 14a, whereby the bipolar power transistor 13a correspondingly switches on and receives the cut-off energy of the coil section, converts it into heat and emits it to the environment. Overall, the circuitry acts like a Z-diode, but the power loss limits and controllability are significantly improved. Due to the magnitude of the base current of the transistors 14a, 13a and due to the current gain of the transistors 14a, 13a, the circuitry can be adapted in such a way that the steepness of the signal flanks can be set. Furthermore, an equivalent resistor 16a for the resistance of the coil section 5a is shown.

Figure 3:
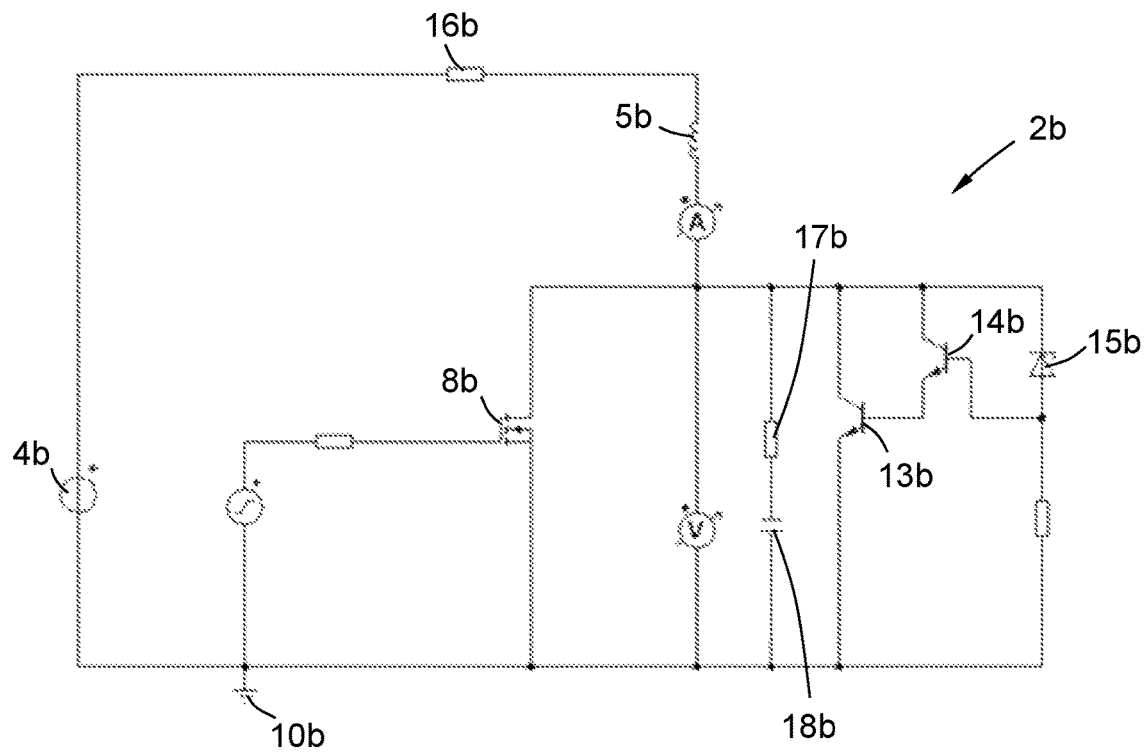
FIG. 3 shows a first variant of the second embodiment.

FIG. 3. Shows a variant of the second embodiment according to FIG. 2 with additional circuit elements. A coil section 5b, a bipolar power transistor 13b, a control transistor 14b, a control Z-diode 15b, an equivalent resistor 16b for the coil section 5b and a field effect transistor 8b for switching the coil section 5b are shown. In addition, a snubber resistor 17b and a snubber capacitor 18b are shown, which form a snubber network. This results in a clean switching slope and thus has a positive effect on the losses in the transistors and the EMC characteristics.

Figure 4:
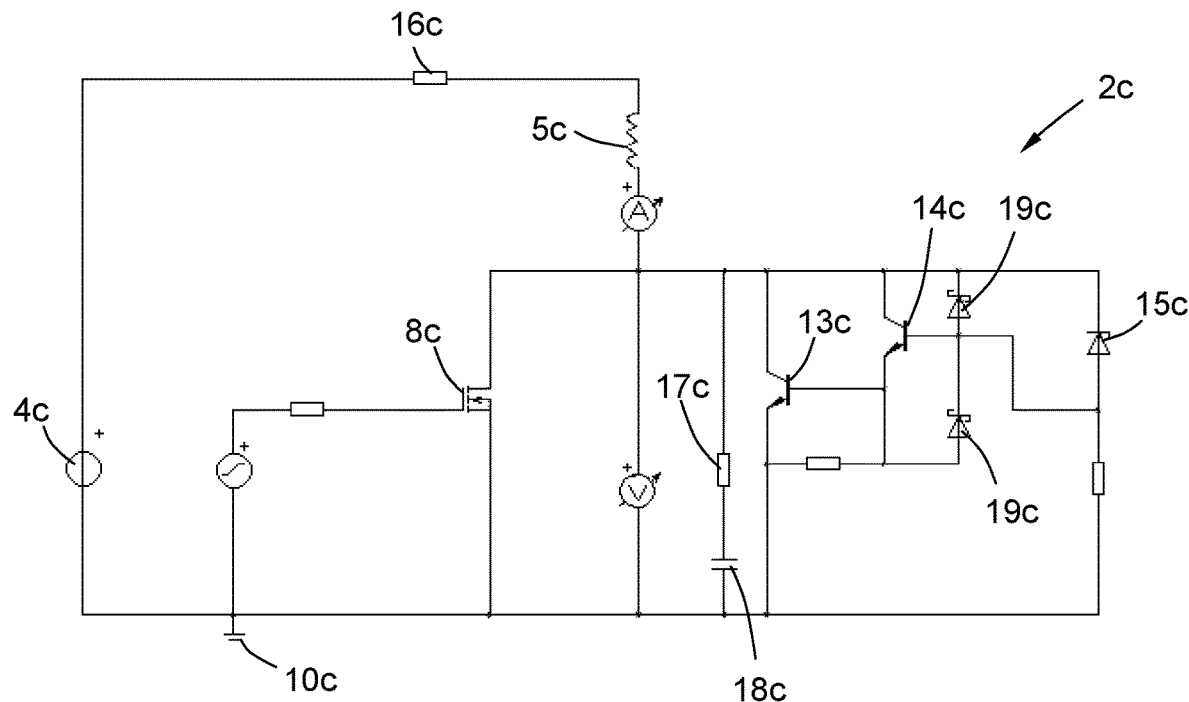
FIG. 4 shows a second variant of the second embodiment.

FIG. 4 shows a second variant of a second embodiment of the invention. In this case, the energy of the coil section 5c, which becomes free as it is switched off, is likewise conducted via a bipolar power transistor 13c. The base of the bipolar power transistor 13c is connected to the emitter of the control transistor 14c. The base of the control transistor 14c is connected to the control Z-diode 15c. After reaching the avalanche voltage of the control Z-diode 15c, a control current flows through via the base-emitter extensor of the control transistor 14c, whereby the bipolar power transistor 13c correspondingly switches on and receives the cut-off energy of the coil section 5c, converts it into heat and emits it to the environment. Overall, the circuitry acts like a Z-diode, but the power loss limits and controllability are significantly improved.

Due to the magnitude of the base current of the transistors 14c, 13c and due to the current gain of the transistors 14c, 13c, the circuitry can be adapted in such a way that the steepness of the signal flanks can be set. Furthermore, an equivalent resistor 16c for the resistance of the coil section 5c is shown. In addition, a snubber resistor 17c and a snubber capacitor 18b are shown, which form a snubber network. This results in a clean switching slope and thus has a positive effect on the losses in the transistors and the EMC characteristics. Schottky diodes 19c are also shown, which ensure that the base emitter voltage at the transistors does not become excessive, and thus quick switching can be ensured. To this end, the base of the control transistor 14c is connected via the Schottky diodes 19c to the coil end of a coil section 5c on the one hand and to the base of the power transistor 13c on the other.

Other variants are conceivable, but these will not be further described here. Furthermore, not each coil section needs to have its own wiring, but rather a single circuit block can be used for both coil sections.

The person skilled in the art concedes that the above-described exemplary embodiments merely have exemplary character, and that the individual aspects of the exemplary embodiments may be combined with one another without departing from the inventive concept.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

LIST OF REFERENCE NUMBERS

1 Principle wiring diagram
2 Partial circuitry
3 Winding
4 Voltage source
5 First coil section
6 Second coil section
7 Center tapping
8 First switching element
9 Second switching element
10 Ground contact
11 First power Z diode
12 Second power Z diode
13 Bipolar power transistor
14 Control transistor
15 Control Z diode
16 Equivalent resistor
17 Snubber resistor
18 Snubber capacitor
19 Schottky diode

What is claimed is:

1. A protection circuit for an electric motor powered by a voltage source, the motor having a single-phase winding which consists of two coil sections each having first and second ends, and a center tapping connected to the voltage source and to the first ends of the two coil sections, the protection circuit comprising:
the second winding ends of the coil sections being connected to ground via a respective field-effect transistor, wherein a cut-off current of a coil section is dispersed via an electrical power component that is connected to the field-effect transistor in parallel, and
an RC attenuator connected between the second end of one of the coil sections and the ground,
wherein the field-effect transistor and a bipolar power transistor are thermally decoupled,
wherein the electrical power component comprises the bipolar power transistor, so that each coil section is assigned the bipolar power transistor, and
wherein the RC attenuator comprises a snubber network.

2. The protection circuit according to claim 1, further comprising means for controlling the cut-off current of a coil section.

3. The protection circuit according to claim 1, wherein the electrical power component comprises a power Z-diode, so that each coil section is assigned a power Z-diode.

4. The protection circuit according to claim 1, wherein the bipolar power transistor can be switched through by a control transistor whose emitter is connected to the base of the bipolar power transistor.

5. The protection circuit according to claim 4, wherein the base of the control transistor is connected to a reverse-biased control Z-diode.

6. The protection circuit according to claim 5, wherein a switching behavior of the control transistor is positively influenced with regard to EMC (Electromagnetic compatibility) behavior by an additional circuit.

7. The protection circuit according to claim 6, wherein the base of the control transistor is connected via Schottky diodes to the second end of a coil section on the one hand and to the base of the power transistor on the other hand.

8. An electric centrifugal pump comprising incorporating the protection circuitry of claim 1.

9. The electric centrifugal pump according to claim 8, further comprising an electric motor wherein the electric motor is a brushless DC motor with a stator winding.

10. The electric centrifugal pump according to claim 8, wherein the centrifugal pump is an auxiliary cooling water pump.

11. The protection circuit according to claim 8, wherein the centrifugal pump is a vehicle cooling water pump.

12. An electric oil mist separator comprising incorporating the protection circuitry of claim 1.

* * * * *